(12) United States Patent
Nishidai et al.

(10) Patent No.: US 8,829,910 B2
(45) Date of Patent: Sep. 9, 2014

(54) PORTABLE DEVICE FOR DISPLAYING CHARGE INFORMATION AND CHARGE INFORMATION DISPLAY SYSTEM

(75) Inventors: Tetsuo Nishidai, Nagoya (JP); Hidemitsu Kawashima, Seto (JP); Yoshiro Tsujiko, Kasugai (JP)

(73) Assignee: Omron Automotive Electronics Co., Ltd., Aichi (JP)

(*) Notice: Subject to any disclaimer, the term of this patent is extended or adjusted under 35 U.S.C. 154(b) by 890 days.

(21) Appl. No.: 12/954,305

(22) Filed: Nov. 24, 2010

(65) Prior Publication Data

US 2011/0128007 A1    Jun. 2, 2011

(30) Foreign Application Priority Data

Nov. 30, 2009 (JP) ................... 2009-271899

(51) Int. Cl.
*H02J 7/02* (2006.01)
*B60L 11/18* (2006.01)
*H02J 7/00* (2006.01)
*G01R 31/36* (2006.01)
*G01R 31/00* (2006.01)

(52) U.S. Cl.
CPC .............. *H02J 7/0047* (2013.01); *H02J 7/027* (2013.01); *Y02T 90/14* (2013.01); *B60L 11/1838* (2013.01); *G01R 31/007* (2013.01); *Y02T 90/163* (2013.01); *Y02T 90/16* (2013.01); *B60L 2250/16* (2013.01); *Y02T 10/84* (2013.01); *G01R 31/3689* (2013.01); *Y02T 10/7005* (2013.01); *H02J 2007/005* (2013.01); *Y02T 10/7088* (2013.01); *Y02T 90/128* (2013.01)
USPC .......................................... 324/427; 701/33.2

(58) Field of Classification Search
USPC ........................................................ 324/427
See application file for complete search history.

(56) References Cited

U.S. PATENT DOCUMENTS

| 5,521,443 A | 5/1996 | Imura et al. |
| 5,596,261 A * | 1/1997 | Suyama ........................ 320/152 |

(Continued)

FOREIGN PATENT DOCUMENTS

| CN | 1854753 A | 11/2006 |
| JP | 04-008133 A | 1/1992 |

(Continued)

OTHER PUBLICATIONS

Extended European Search Report Issued in European Application No. 10193113.7-1242, Dated May 3, 2012 (9 Pages).

(Continued)

*Primary Examiner* — Samuel Berhanu
*Assistant Examiner* — Jerry D Robbins
(74) *Attorney, Agent, or Firm* — Osha Liang LLP

(57) ABSTRACT

A portable device for displaying charge information has a transmission unit for wirelessly transmitting a signal, requesting charge information on a battery, to a controller provided with a unit for detecting a remaining amount of a battery, a reception unit for wirelessly receiving the charge information from the controller, a storage unit for storing charge information received by the reception unit, a display unit for displaying charge information stored into the storage unit, and a charge prediction information calculating unit for calculating prediction information regarding a state-of-charge of the battery based upon charge information stored in the storage unit in the case of the reception unit being unable to receive charge information from the controller after transmitting a signal requesting charge information from the transmission unit. The prediction information calculated by the charge prediction information calculating unit is displayed in the display unit.

7 Claims, 13 Drawing Sheets

(56) References Cited

U.S. PATENT DOCUMENTS

| | | | |
|---|---|---|---|
| 5,739,674 A * | 4/1998 | Kawahara et al. | 320/106 |
| 7,362,263 B2 | 4/2008 | McBurney et al. | |
| 7,450,062 B2 | 11/2008 | McBurney et al. | |
| 7,592,951 B2 | 9/2009 | McBurney et al. | |
| 7,598,909 B2 | 10/2009 | McBurney et al. | |
| 2005/0052317 A1 | 3/2005 | McBurney et al. | |
| 2008/0039980 A1* | 2/2008 | Pollack et al. | 700/295 |
| 2009/0021385 A1* | 1/2009 | Kelty et al. | 340/660 |
| 2009/0139781 A1* | 6/2009 | Straubel | 180/65.1 |

FOREIGN PATENT DOCUMENTS

| | | |
|---|---|---|
| JP | 09-116977 | 5/1997 |
| JP | 2007-57273 | 3/2007 |
| JP | 2008-104093 A | 5/2008 |
| JP | 2008247080 A | 10/2008 |
| JP | 2009-54302 | 3/2009 |
| JP | 2009-177509 | 8/2009 |

OTHER PUBLICATIONS

Marlyn Williams, "Nissan Dials IPhone for Car Remote Control", PC World, http://www.pcworld.com/printable/article/id,169078/printable.html (1 Page).

Patent Abstracts of Japan for patent application with Publication No. 2009-054302, Publication Date: Mar. 12, 2009, 10 pages.

Patent Abstracts of Japan for patent application with Publication No. 2007-057273, Publication Date: Mar. 8, 2007, 23 pages.

Patent Abstracts of Japan for patent application with Publication No. 2009-177509, Publication Date: Aug. 6, 2009, 64 pages.

Office Action Issued in Japanese Application No. 2009-271899, Dated Apr. 10, 2013 (6 Pages With English Translation).

Office Action Issued in Japanese Application No. 2009-271899, Dated Mar. 18, 2014 (4 pages).

Patent Abstracts of Japan for Japanese Publication No. 2008-104093, publication date May 1, 2008 (1 page).

* cited by examiner

PORTABLE DEVICE FOR DISPLAYING CHARGE INFORMATION AND CHARGE INFORMATION DISPLAY SYSTEM

BACKGROUND OF THE INVENTION

1. Technical Field

The present invention relates to a portable device for displaying charge information, which for example displays a remaining amount of a battery for a vehicle, and also relates to a charge information display system made up of the portable device and a controller.

2. Related Art

In recent years, environment-responsive cars (so-called eco-cars) such as hybrid cars and electronic cars have attracted attention in the automobile industry. The hybrid car is a car powered by an electronic motor besides a gasoline engine. The electronic car is a car powered by the electric motor alone. By the use of the electric motor, these environment-responsive cars can suppress consumption of gasoline and emission of carbon oxide, and have thus been expected to prevail as new-generation cars that contribute to protection of the global environment.

In the environment-responsive car as thus described, a battery such as a lithium-ion battery is used as a driving source of the electric motor. This battery can be externally charged. As the method for charging the battery, there are methods such as a method for performing charging directly from a domestic power supply, and a method for performing charging through the use of a fast charger installed in a shopping mall or the like. In any case, if charge information on a battery such as a remaining amount thereof can be checked whenever necessary, the battery can be charged at the time of need, which is convenient for a user. Thereat, systems have hitherto been proposed in which charge information on a battery is notified from a device mounted with the battery to a portable terminal or the like (e.g. see Japanese Unexamined Patent Publication No. 2009-54302, Japanese Unexamined Patent Publication No. 2007-57273, and Japanese Unexamined Patent Publication No. 2009-177509).

Japanese Unexamined Patent Publication No. 2009-54302 describes that, whether or not a battery is normal or whether or not display of detailed history data on the battery is necessary is determined based upon data from a battery-state determining device, and only when the display of the history data is determined as necessary, the data is displayed in externally located another section.

Japanese Unexamined Patent Publication No. 2007-57273 describes that, when a wireless slave, connected to terminal equipment and driven by a battery, receives an inquiry signal from a portable terminal for communicating information with the terminal equipment, the slave transmits a remaining-amount signal indicating a remaining amount of the battery to the portable terminal device.

Japanese Unexamined Patent Publication No. 2009-177509 describes that, when a decrease in remaining amount of a battery for a cellular phone to a reference value is detected, a remaining-amount notification signal is transmitted from the cellular phone to a subscriber data managing unit, and when the remaining amount of the battery recovers by charging, a recovery signal is transmitted from the cellular phone to the subscriber data managing unit.

SUMMARY

In the hybrid car and the electric car, as a unit for checking charge information on a battery, a system is considered in which information such as a battery remaining amount is wirelessly transmitted from a controller mounted in the vehicle to a portable device, and the information is displayed in a display section of the portable device. However, for example in the case of charging a battery with a charger installed in a car park of a shopping mall, the user may leave his or her car for the purpose of shopping or the like. Then, due to the mall being a reinforced concrete building, radio waves are blocked between the portable device owned by the user and the controller of the vehicle, which prevents communication therebetween. In this case, since the portable device cannot obtain charge information on the battery from the controller, the charge information is not displayed in the display section. This makes it impossible for the user to know a current battery remaining amount, time before completion of charging, and the like, which is inconvenient.

One or more embodiments of the present invention provides a portable device for displaying charge information and a charge information display system which offer benefits to a user by displaying charge information and the like based upon predictions even in the case of a portable device and a controller being unable to communicate with each other.

In accordance with one aspect of the present invention, a portable device for displaying charge information includes: a transmission unit for wirelessly transmitting a signal, requesting charge information on a battery, to a controller provided with a unit for detecting a remaining amount of a battery; a reception unit for wirelessly receiving the charge information from the controller; a storage unit for storing charge information received by this reception unit; and a display unit for displaying charge information stored into this storage unit, the device further including a charge prediction information calculating unit. The charge prediction information calculating unit calculates prediction information regarding a state-of-charge of the battery based upon charge information stored in the storage unit when the reception unit cannot receive charge information from the controller after transmitting a signal requesting charge information from the transmission unit. This prediction information is displayed in the display unit.

In this manner, even when the portable device for displaying charge information cannot receive charge information from the controller, the charge prediction information calculating unit calculates prediction information regarding a state-of-charge of the battery on the portable device side. It is thus possible, by displaying the prediction information in the display unit of the portable device, to notify the user of information with certain accuracy regarding, for example, a battery remaining amount and time before completion of charging.

In one or more embodiments of the present invention, during charging of a battery, the reception unit receives charge characteristic data on the battery from the controller. The charge characteristic data received by the reception unit is stored into the storage unit. The charge prediction information calculating unit then calculates prediction information based upon charge information and charge characteristic data which are stored in the storage unit.

In this manner, the charge prediction information calculating unit calculates prediction information based upon a charge characteristic obtained from the controller at the point of charging a battery, whereby it is possible to obtain highly accurate prediction information with a state, characteristics, surroundings and the like of the battery during charging taken into consideration.

In one or more embodiments of the present invention, the charge prediction information calculating unit calculates prediction information including a predicted remaining amount of the battery and predicted time before completion of charging.

In this manner, a battery remaining amount and time before completion of charging are respectively calculated as predicted values, whereby it is possible to easily see estimations of the remaining amount and the time in the portable device for displaying charge information.

The portable device for displaying charge information according to one or more embodiments of the present invention may further include a first determination unit for determining whether or not a predetermined period has elapsed from past receipt of charge information in the case of the reception unit being unable to receive charge information from the controller after transmitting a signal requesting charge information from the transmission unit. In this case, when it is determined by the first determination unit that the predetermined period has elapsed, past charge information stored in the storage unit is displayed in the display unit.

In this manner, even when a long period has elapsed from past receipt of charge information in the state of the portable device and the controller being unable to communicate with each other, it is possible for the user to at least know the past charge information.

Further, in one or more embodiments of the present invention, in addition to the first determination unit, a second determination unit may also be included which determines whether or not charge information received in the past is stored in the storage unit. In this case, when it is determined by the first determination unit that the predetermined period has not elapsed and it is determined by the second determination unit that the charge information is stored in the storage unit, the charge prediction information calculating unit calculates the prediction information.

In accordance with another aspect of the present invention, a charge information display system is made up of a controller and a portable device for displaying charge information. The controller is provided with: a remaining amount detecting unit for detecting a remaining amount of a battery; and a first transmission unit for transmitting charge information on a battery, which includes a remaining amount detected in the remaining amount detecting unit. Further, the portable device for displaying charge information is provided with: a second transmission unit for wirelessly transmitting to the controller a signal requesting the charge information; a reception unit for wirelessly receiving the charge information from the controller, a storage unit for storing charge information received by the reception unit; a charge prediction information calculating unit for calculating prediction information regarding a state-of-charge of the battery based upon charge information stored in the storage unit in the case of the reception unit being unable to receive charge information from the controller after transmitting a signal requesting charge information from the second transmission unit; and a display unit for displaying the charge information stored into the storage unit or the prediction information calculated by the charge prediction information calculating unit.

In one or more embodiments of the present invention, during charging of a battery, the controller generates charge characteristic data representing a charged amount of the battery with respect to charging time for the battery, and transmits the data from the first transmission unit to the portable device for displaying charge information. The charge characteristic data in this case is generated, for example, based upon a current remaining amount, an ambient temperature and a charging system of the battery.

In this manner, charge characteristic data at the point of charging a battery is generated in the controller, and in the portable device for displaying charge information, the charge prediction information calculating unit calculates prediction information based upon the data obtained from the controller. It is thereby possible to obtain highly accurate prediction information with surroundings, such as an ambient temperature, of the battery during charging taken into consideration.

Further, in the portable device for displaying charge information according to one or more embodiments of the present invention, a charging start time (or charged amount) stored in the storage unit may be displayed in the display unit when the reception unit cannot receive charge information from the controller after transmitting a signal requesting charge information from the transmission unit.

According to one or more embodiments of the present invention, even when the portable device and the controller cannot communicate with each other, charge information and the like based upon predictions are displayed in the portable device, thereby to offer benefits to the user.

DETAILED DESCRIPTION

Next, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Hereinafter, a system for displaying charge information on a battery mounted in an electric car or a hybrid car (hereinafter generally referred to as "vehicle") will be cited as an example.

Figure 1:
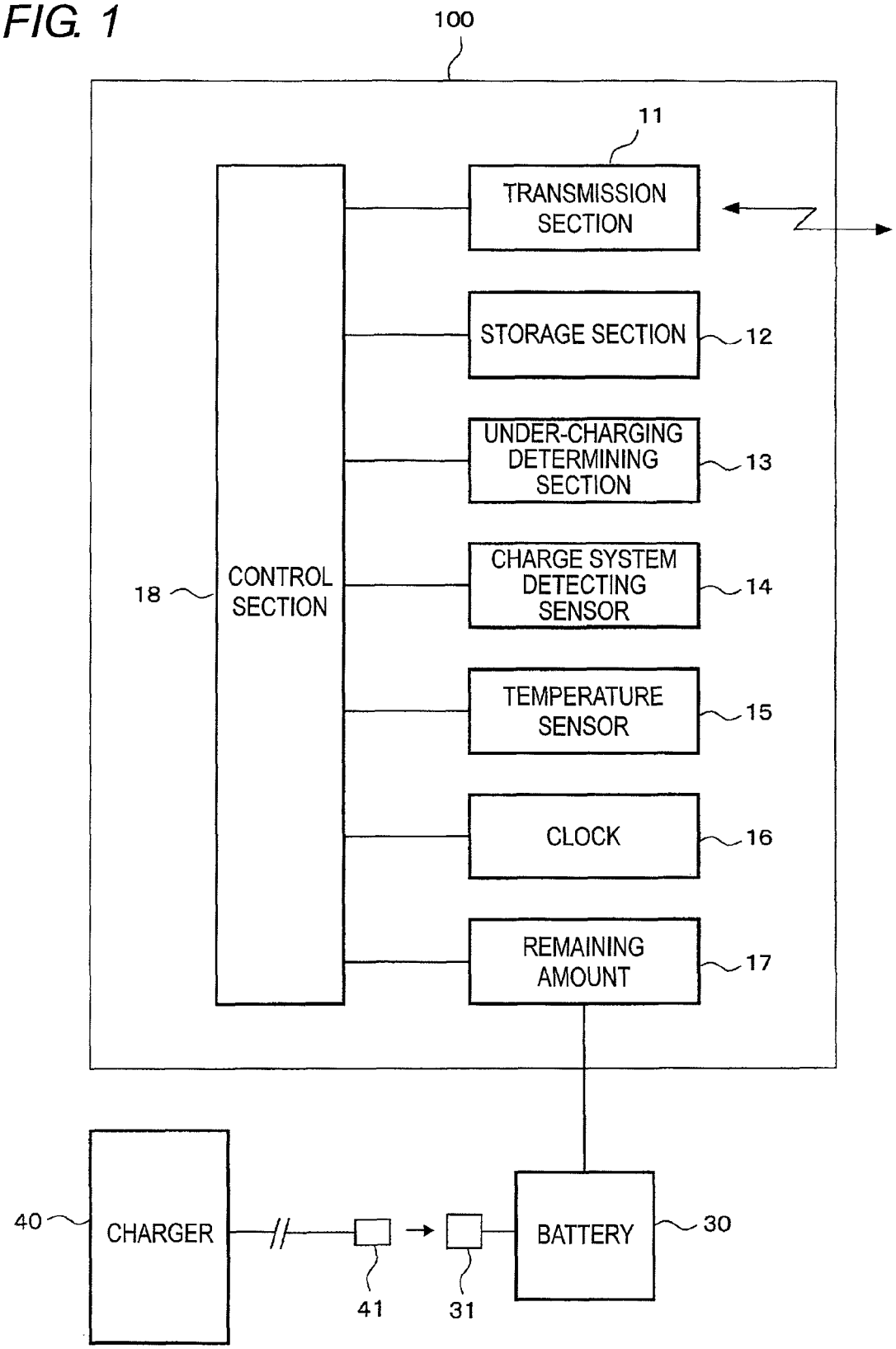
FIG. 1 is a block diagram of a controller mounted in a vehicle.
Figure 2:
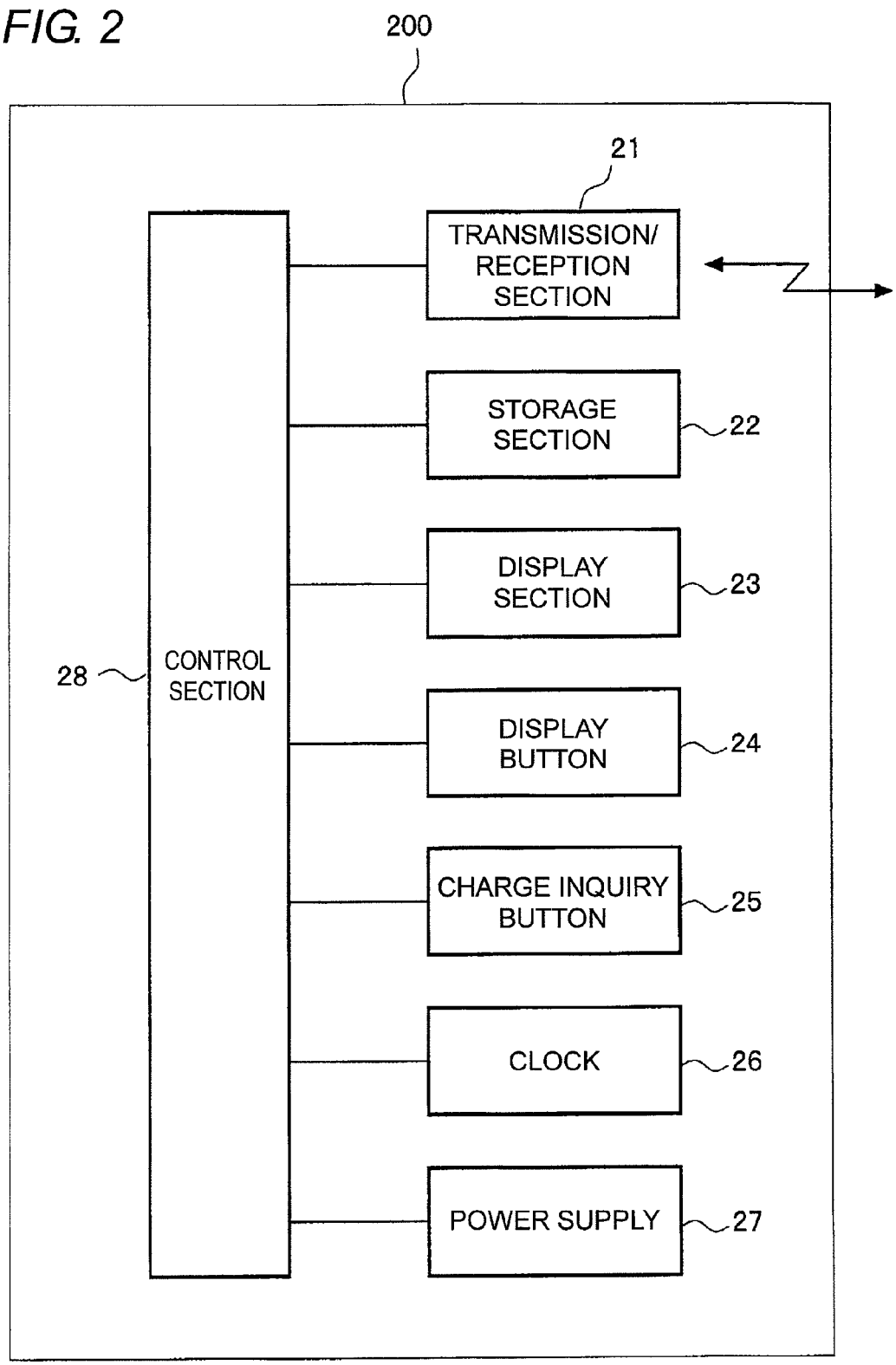
FIG. 2 is a block diagram of a portable device for displaying charge information.

FIG. 1 is an example of a controller (hereinafter referred to as "in-vehicle device") mounted in a vehicle, and FIG. 2 is an example of a portable device for displaying charge information (hereinafter referred to as "portable device"), which is owned by a user. These in-vehicle device and portable device constitute a charge information display system according to one or more embodiments of the present invention.

First, a configuration of the in-vehicle device will be described. In FIG. 1, an in-vehicle device 100 is provided with a transmission/reception section 11, a storage section 12, an under-charging determining switch 13, a charge system detecting sensor 14, a temperature sensor 15, a clock 16, a remaining amount detecting section 17, and a control section 18. It is to be noted that, other than the above, the in-vehicle device 100 is provided with a circuit, a censor and the like for controlling each section of the vehicle, but those are omitted from the figure due to being not directly relevant to one or more embodiments of the present invention.

The transmission/reception section 11 is made up of a transmission/reception antenna, a transmission circuit and a reception circuit, and wirelessly exchanges data with a transmission/reception section 21 (FIG. 2) of a later-mentioned portable device 200. The storage section 12 is made up of a rewritable, nonvolatile semiconductor memory (e.g. flash memory). The under-charging determining switch 13 is a switch for determining whether or not a battery 30 is under charging, and mechanically detects that a charge plug 41 of a charger 40 has been connected to a socket 31 of the battery 30. The charge system detecting sensor 14 detects which voltage a charging system is, 100V, 200V or three-phase 200V. The temperature sensor 15 is made up of a temperature sensor such as a thermistor, and detects an ambient temperature of the battery 30. The clock 16 is made up of a timer circuit for counting time, and the like. The remaining amount detecting section 17 monitors a voltage level of the battery 30, and detects a remaining amount (charged amount) of the battery 30 based upon the voltage level. The control section 18 is made up of a CPU, a ROM, a RAM, and the like, and controls operations of the in-vehicle device 100.

The battery 30 is a chargeable secondary battery (storage battery) and is made up, for example, of a lithium-ion battery. The battery 30 is electrically connected with the socket 31. This socket 31 is mounted at a charge plug inlet provided on the side surface of the vehicle. The charger 40 is made up of a power supply circuit and a control circuit, and installed in a car park of a shopping mall, for example. Further, the charger 40 is equipped with the charge plug 41. By connecting this charge plug 41 to the socket 31, the battery 30 is charged from the charger 40. It is to be noted that, although the example of the charge plug 41 and the socket 31 being brought into mechanical contact with each other to perform charging is herein cited as an example, the battery 30 can also be charged by noncontact power supply through the use of electromagnetic induction.

In the above configuration of the in-vehicle device 100, the transmission/reception section 11 is an example of the transmission unit according to one or more embodiments of the present invention, and the remaining amount detecting section 17 is an example of the remaining amount detecting unit according to one or more embodiments of the present invention.

Next, a configuration of the portable device is described. In FIG. 2, the portable device 200 is provided with the transmission/reception section 21, a storage section 22, a display section 23, a display button 24, a charge inquiry button 25, a clock 26, a power supply 27, and a control section 28.

The transmission/reception section 21 is made up of a transmission/reception antenna, a transmission circuit and a reception circuit, and wirelessly exchanges data with the transmission/reception section 11 (FIG. 1) of the in-vehicle device 100. The storage section 22 is made up of a rewritable, nonvolatile semiconductor memory (e.g. flash memory). The display section 23 is made up of a crystal liquid display or the like, and displays later-mentioned charge information on its screen. The display button 24 is a button that is operated at the time of switching the display section 23 from an off-state to an on-state to make information displayed on the screen. The charge inquiry button 25 is a button that is operated at the time of inquiring of the in-vehicle device 100 about a remaining amount of the battery 30, time before completion of charging, and the like. The clock 26 is made up of a timer circuit for counting time, and the like. The power supply 27 is made up, for example, of a lithium button battery. The control section 28 is made up of a CPU, a ROM, a RAM, and the like, and controls operations of the portable device 200.

Figure 3:
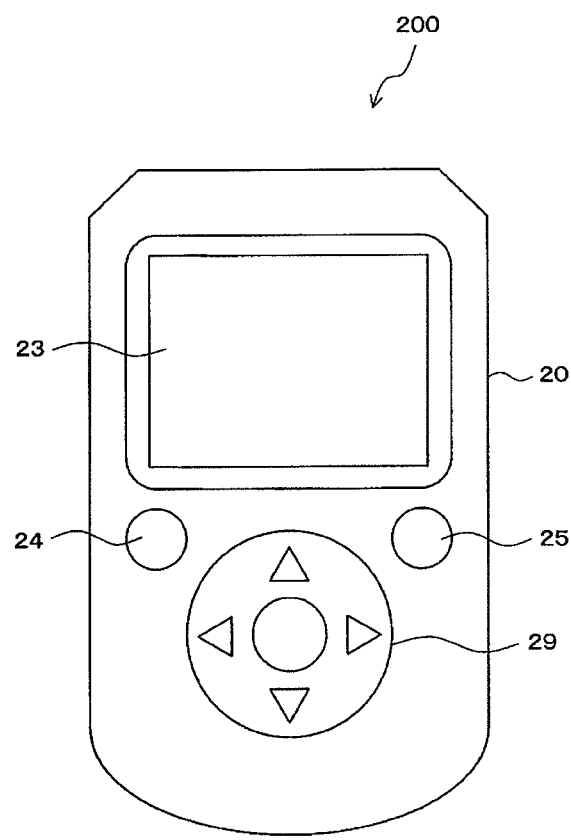
FIG. 3 is an external view of the portable device for displaying charge information.

FIG. 3 is an external view showing an example of the portable device 200. In FIG. 3, the same numerals are given to the same portions as those in FIG. 2. On the front surface of a portable device body 20, the foregoing display section 23, display button 24 and charge inquiry button 25 are provided, and further, an operation key 29 is provided for performing predetermined operations on the screen of the display section 23. Moreover, inside the portable device body 20, the foregoing transmission/reception section 21, storage section 22, clock 26, power supply 27 and the control section 28 are accommodated.

In the above configuration of the portable device 200, the transmission/reception section 21 is an example of the transmission unit and the reception unit according to one or more embodiments of the present invention, and the storage section 22 is an example of the storage unit according to one or more embodiments of the present invention. Further, the display section 23 is an example of the display unit according to one or more embodiments of the present invention, and the control section 28 is an example of the charge prediction information calculating unit, the first determining unit, and the second determining unit.

Next, operations of the charge information display system provided with the configuration as thus described will be described with reference to flowcharts.

Figure 4:
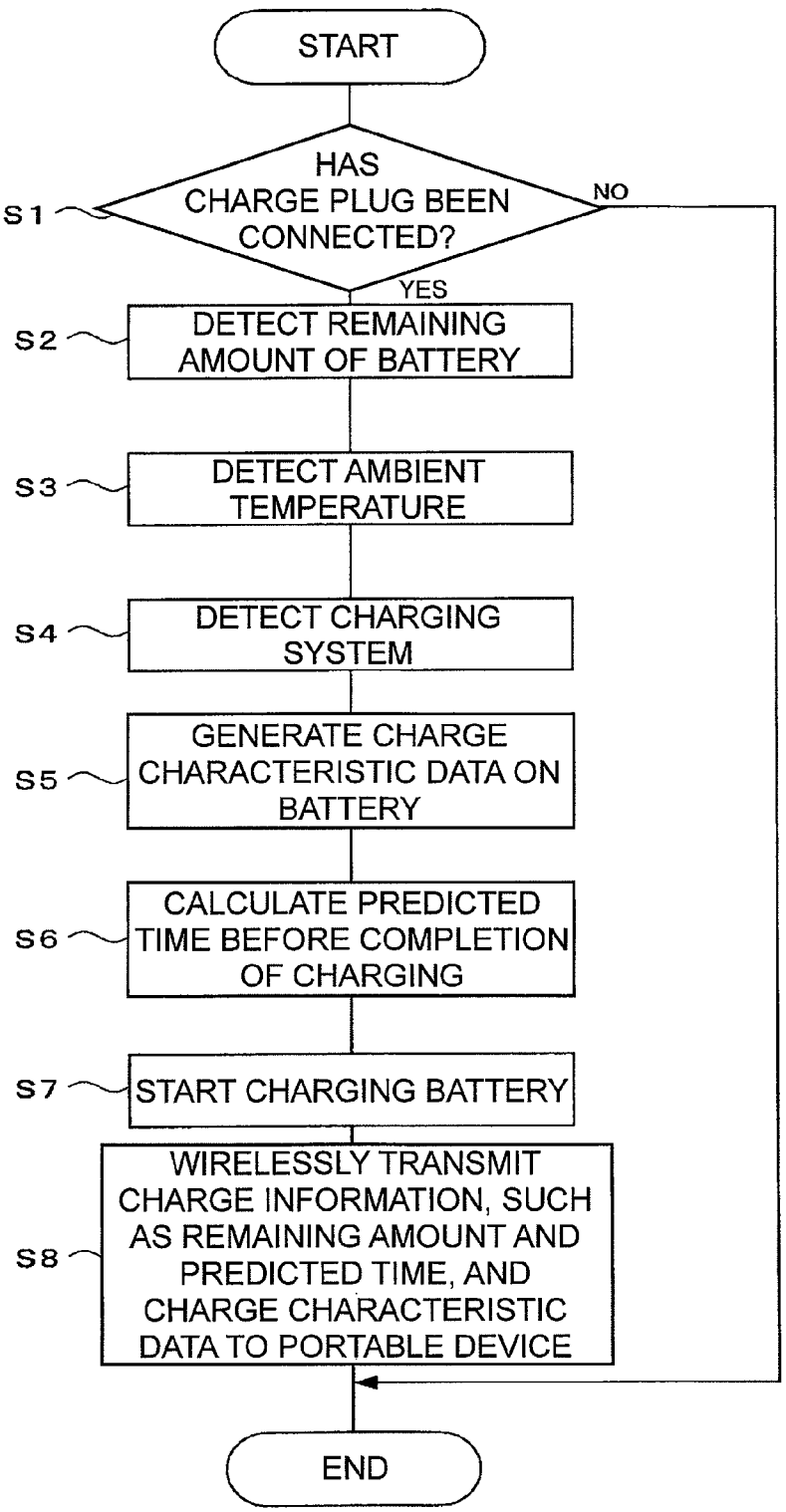
FIG. 4 is a flowchart showing operations of the controller.

FIG. 4 is a flowchart showing operations of the in-vehicle device 100 at the time when the charge plug 41 is connected to the socket 31. Each step of this flowchart is executed by the CPU of the control section 18. In Step S1, it is determined whether or not the charge plug 41 has been connected to the socket 31 based upon the operation state (on or off) of the under-charging determining switch 13. When the charge plug 41 has not been connected to the socket 31 (Step S1: NO), the process is completed without executing Steps S2 to S8. When the charge plug 41 is connected to the socket 31 (Step S1: YES), the process is advanced to Step S2.

In Step S2, a current remaining amount of the battery 30 is detected by the remaining amount detecting section 17. Next, in Step S3, an ambient temperature of the battery 30 is detected by the temperature sensor 15. Further, in Step S4, a charging system (100 V, 200 V or three-phase 200 V) is detected by the charge system detecting sensor 14. Subsequently, the process is advanced to Step S5, and charge characteristic data on the battery 30 is generated based upon the information obtained in Steps S2 to S4.

Figure 5:
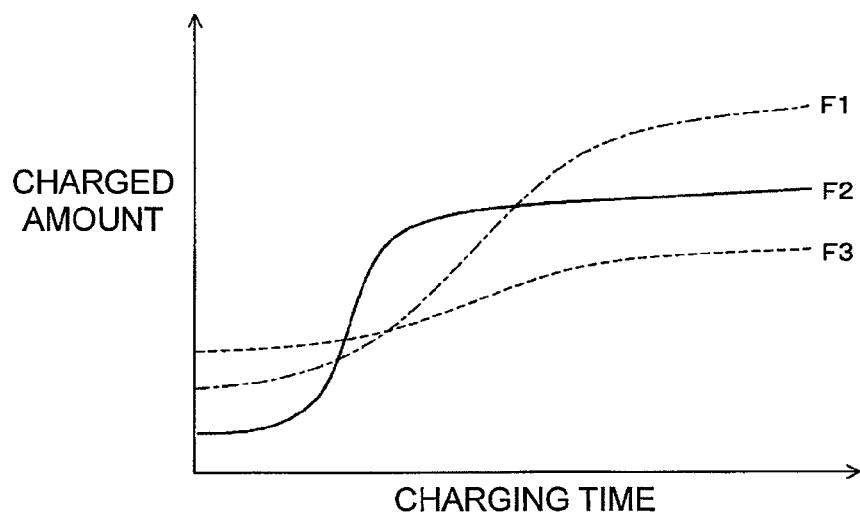
FIG. 5 is a graph showing charge characteristics of a battery.

FIG. 5 is a graph showing an example of charge characteristics of the battery 30. This charge characteristic is a representation of a change in charged amount with respect to charging time. The charged amount is expressed in percent with a full charge amount taken as 100. There are a variety of characteristics, such as F1, F2 and F3, depending upon the remaining amount, the ambient temperature and the charging system of the battery 30. In Step S5, data on the charged amount with respect to the charging time is generated.

Next, in Step S6, predicted time before completion of charging of the battery 30 is calculated based upon the foregoing charge characteristic data. In FIG. 5, this predicted time is the time between the start of charging and the time when the charged amount comes into a saturated state. Subsequently, in Step S7, the battery 30 is charged from the charge plug 41 through the socket 31. Further in Step S8, the charge information on the battery 30 is transmitted from the transmission/reception section 11 to the portable device 200 along with the charge characteristic data. The charge information includes the battery 30 being under charging, the remaining amount (charged amount) of the battery 30, the predicted time before completion of charging, and the like. This is the end of a series of operations.

Figure 6:
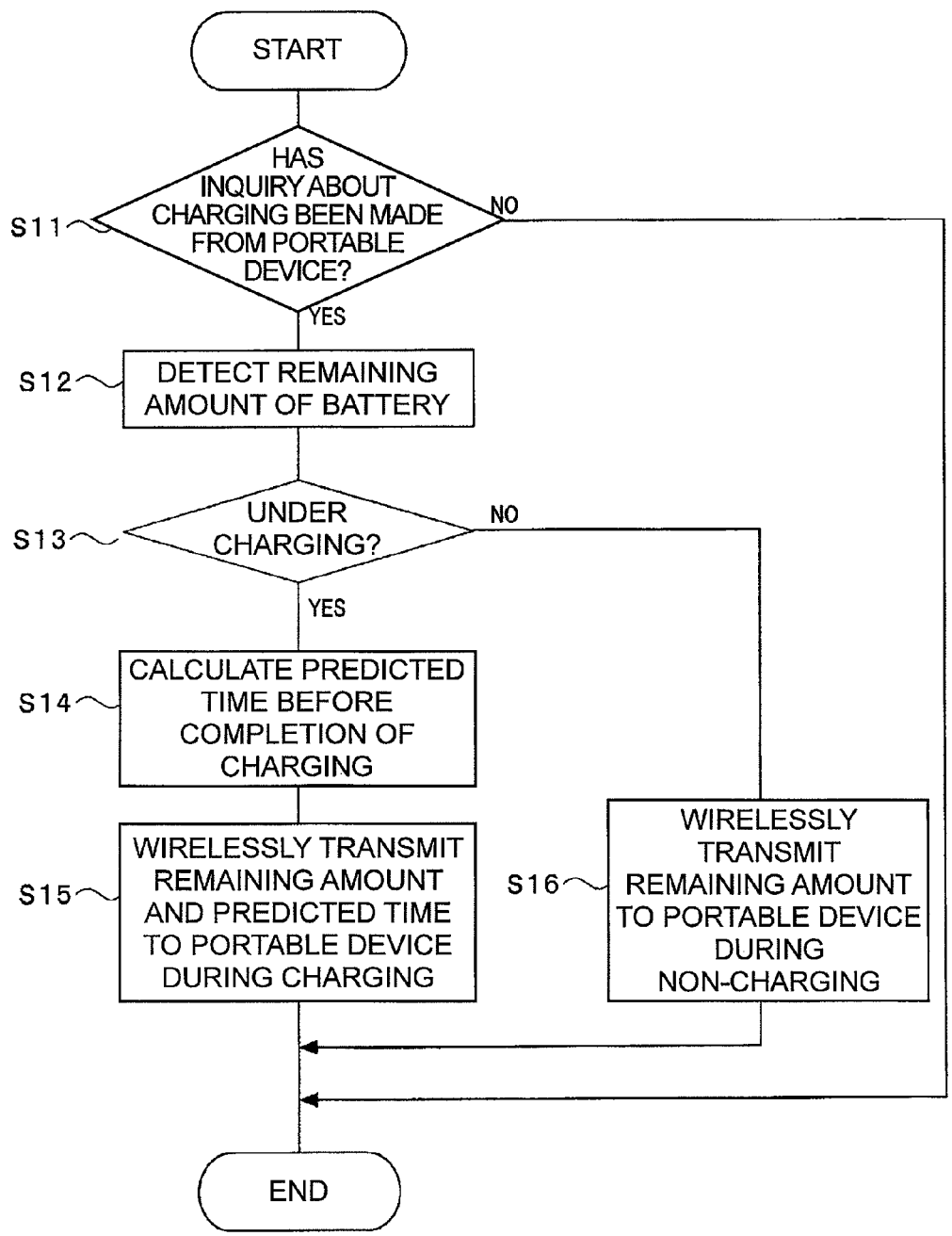
FIG. 6 is a flowchart showing operations of the controller.

FIG. 6 is a flowchart showing operations of the in-vehicle device 100 at the time when charge information is inquired from the portable device 200. Each step of this flowchart is executed by the CPU of the control section 18. In Step S11, it is checked whether or not an inquiry about charge information has been made based upon whether or not the transmission/reception section 11 has received a request signal for charge information from the portable device 200. When no inquiry about charge information is made (Step S11: NO), the process is completed without executing Steps S12 to S16. When an inquiry about charge information is made (Step S11: YES), the process is advanced to Step S12.

In Step S12, a remaining amount of the battery 30 at that point is detected by the remaining amount detecting section 17. Next, in Step S13, it is determined whether or not the battery 30 is under charging based upon the operation state (on or off) of the under-charging determining switch 13. When the battery 30 is under charging (Step S13: YES), the process is advanced to Step S14, and predicted time before completion of charging is calculated using a remaining amount of the battery and charge characteristic data. Then, in Step S15, charge information, such as the battery 30 being under charging, the remaining amount (charged amount) of the battery 30, and the predicted time before completion of charging, is transmitted to the portable device 200 through the transmission/reception section 11, and the operation is completed.

Further, when it is determined in Step S13 that the battery 30 is not under charging (Step S13: NO), the process is advanced to Step S16. In Step S16, charge information, such as the battery 30 being not under charging and the remaining amount of the battery 30, is transmitted to the portable device 200 through the transmission/reception section 11, and the operation is completed.

Figure 7:
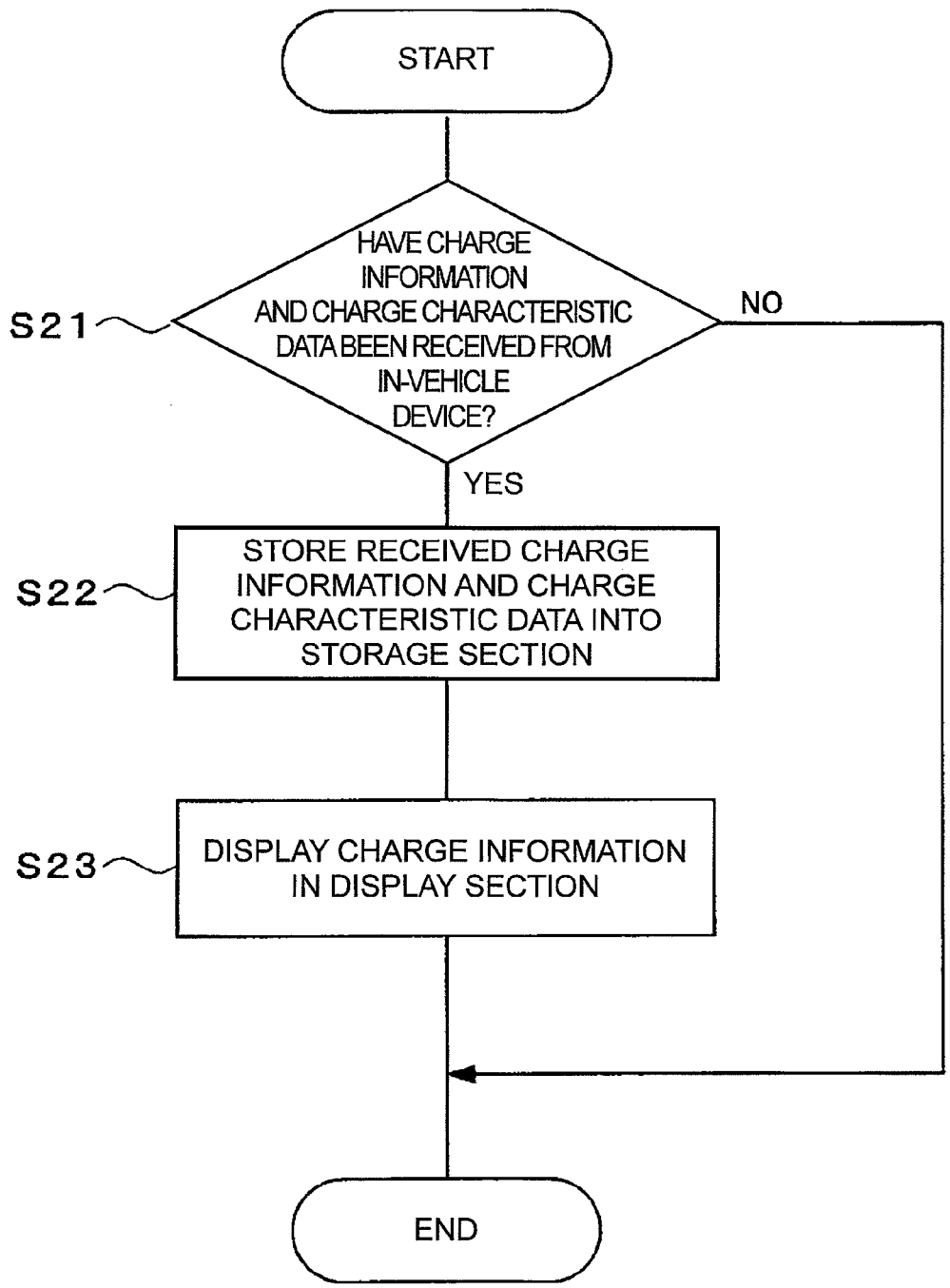
FIG. 7 is a flowchart showing operations of the portable device for displaying charge information.

FIG. 7 is a flowchart showing operations of the portable device 200 at the time when charge information is received from the in-vehicle device 100. Each step of this flowchart is executed by the CPU of the control section 28. It is to be noted that charge information such as a battery remaining amount is transmitted from the in-vehicle device 100 at the time of connection of the charge plug (Step S8 of FIG. 4), and thereafter, the information is regularly transmitted to the portable device 200 with specific time intervals. Meanwhile, charge characteristic data is transmitted from the in-vehicle device 100 every time the charge plug is connected (Step S8 of FIG. 4).

In Step S21, it is determined whether or not the transmission/reception section 21 has received charge information or charge characteristic data from the in-vehicle device 100. When the charge information or the like has not been received (Step S21: NO), the process is completed without executing Steps S22 and S23. When the charge information or the like is received (Step S21: YES), the process is advanced to Step S22.

In Step S22, the charge information received from the in-vehicle device 100 is stored into the storage section 22. Also when the charge characteristic data is received, the data is stored into the storage section 22 as above. In subsequent Step S23, the charge information stored into the storage section 22 is displayed in the display section 23. Thereby, the state (under charging or not under charging) of the battery 30, its remaining amount, time before completion of charging, and the like are displayed in the display section 23 of the portable device 200, for example as shown in FIG. 9.

Figure 8:
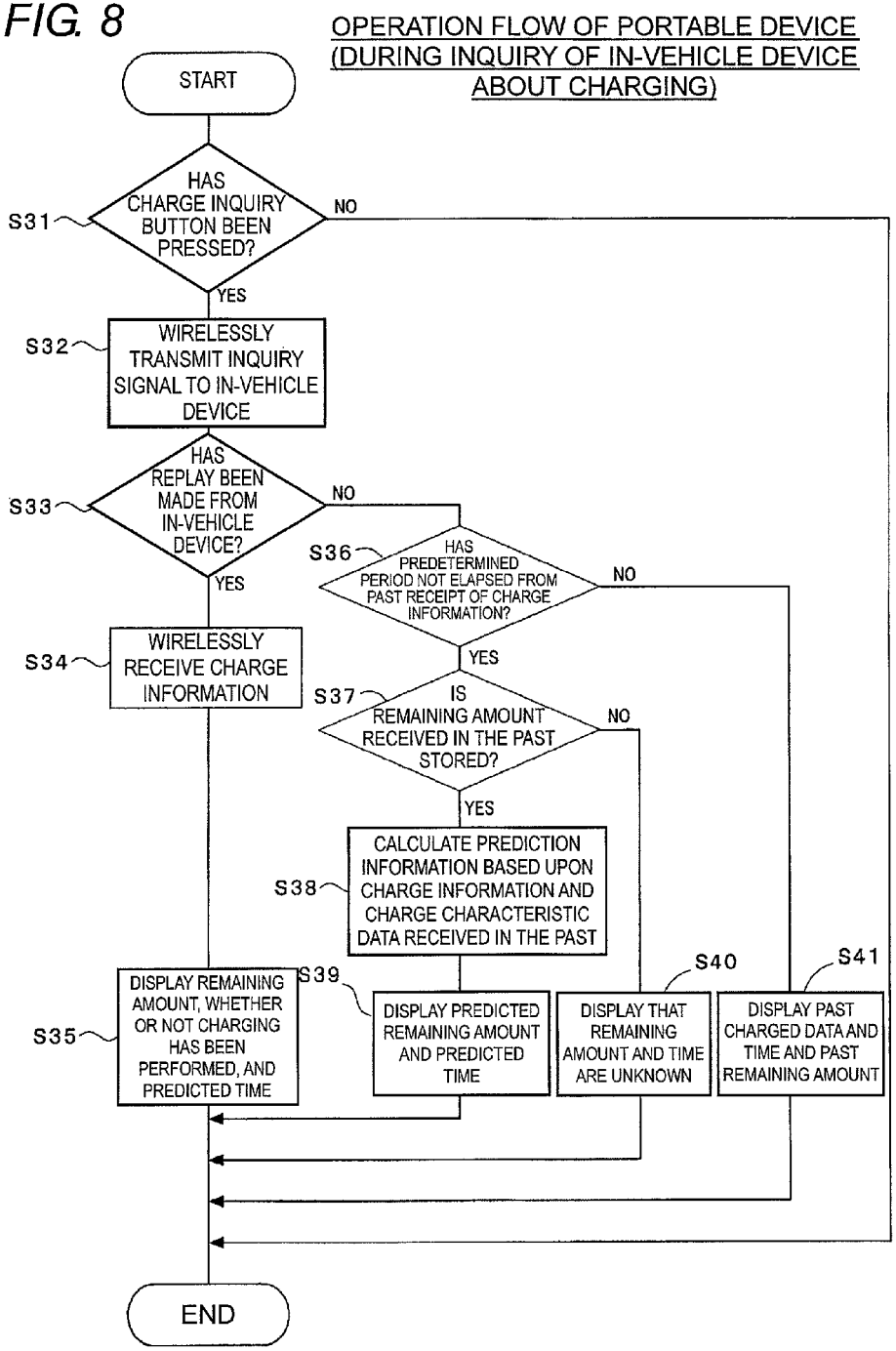
FIG. 8 is a flowchart showing operations of the portable device for displaying charge information.

FIG. 8 is a flowchart showing operations of the portable device 200 at the time of making an inquiry of the in-vehicle device 100 about charge information. Each step of this flowchart is executed by the CPU of the control section 28. In Step S31, it is checked whether or not the charge inquiry button 25 of the portable device 200 has been pressed. When the charge inquiry button 25 has not been pressed (Step S31: NO), the process is completed without executing Steps S32 to S41. When the charge inquiry button 25 is pressed (Step S31: YES), the process is advanced to Step S32.

In Step S32, a signal requesting charge information on the battery 30 (hereinafter referred to as "inquiry signal") is generated, and transmitted from the transmission/reception section 21 to the in-vehicle device 100. Subsequently, in Step S33, a reply (response signal) from the in-vehicle device 100 is waited for. When a reply is made from the in-vehicle device 100 (Step S33: YES), the process is advanced to Step S34. In Step S34, the charge information transmitted by the in-vehicle device 100 in Step S15 or S16 of FIG. 6 is wirelessly received. Then, in Step S35, a battery remaining amount, whether or not the battery has been charged, predicted time before completion of charging, and the like are displayed in the display section 23 of the portable device 200 based upon the received charge information, and the process is completed.

Figure 9:
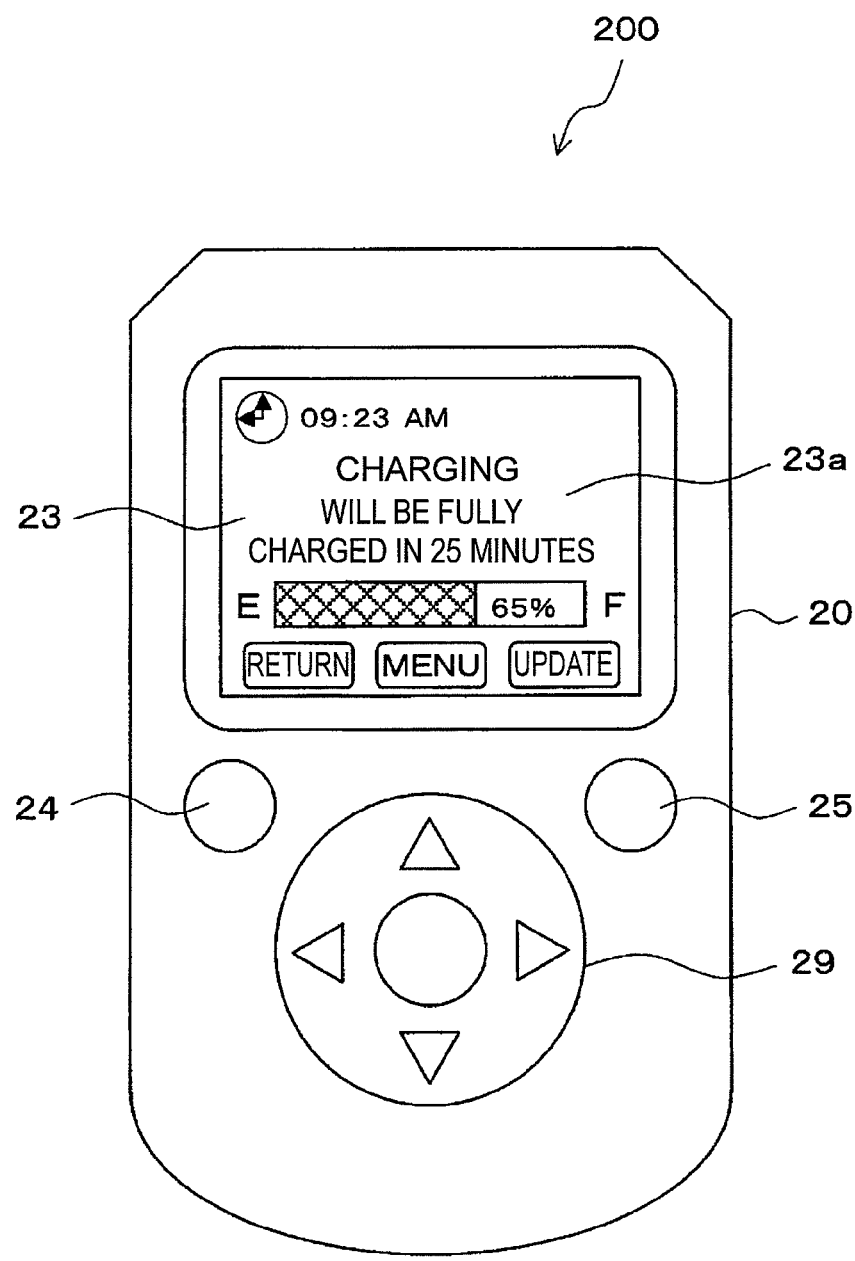
FIG. 9 is a view showing a display example of charge information.
Figure 10:
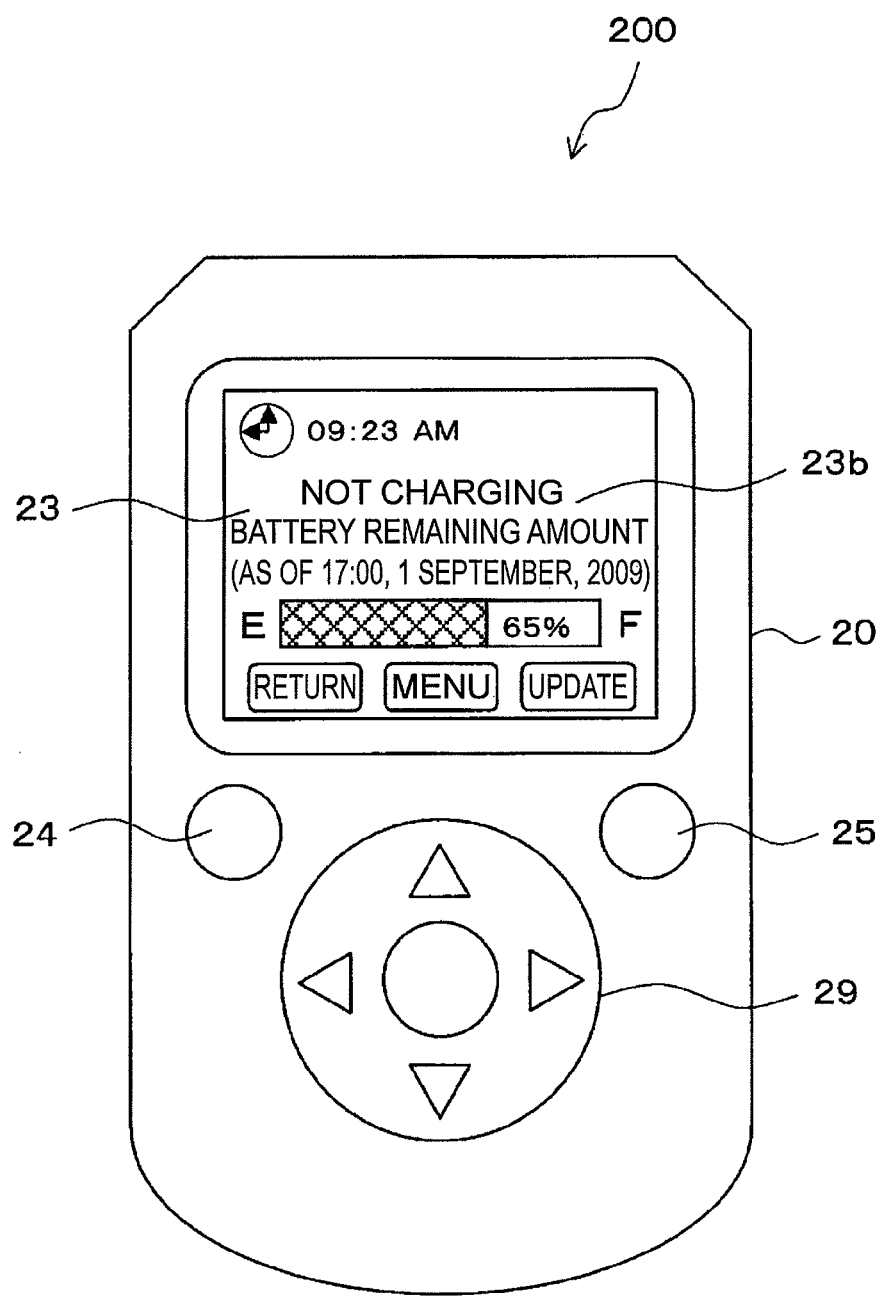
FIG. 10 is a view showing another display example of charge information.

FIGS. 9 and 10 each show a display example of the display section 23 in Step S35. FIG. 9 is a display example of the case of the battery 30 being under charging. Based upon the information transmitted by the in-vehicle device 100 in Step S15 of FIG. 6, information 23a is displayed on the screen of the display section 23, the information 23a indicating that the battery 300 is under charging, time before completion of charging is 25 minutes, a remaining amount (charged amount) of the battery 300 is 65%, and the like. Although the battery remaining amount is herein displayed using both a bar graph and a numeral value, it may be displayed using either one of them. It is to be noted that "E" at the left end of the bar graph represents the remaining amount being 0% (Empty), and "F" at the right end thereof represents the remaining amount being 100% (Full). Further, a current time is displayed at the top of the screen of the display section 23, and operation buttons are displayed at the bottom of the screen.

FIG. 10 is a display example of the case of the battery 30 being not under charging. In this case, based upon the information transmitted by the in-vehicle device 100 in Step S16 of FIG. 6, information 23b is displayed on the screen of the display section 23, the information 23b indicating that the battery 30 is not under charging, a battery remaining amount on a date shown in the figure is 65%, and the like.

Returning to FIG. 8, in Step S33, when no reply is made from the in-vehicle device 100 (Step S33: NO), the process is advanced to Step S36. As the case of no reply, there is for example considered a case where the portable device 200 is located inside a reinforced concrete building and is thus in the state of being unable to communicate with the in-vehicle device 100 located outside.

In Step S36, it is verified, with reference to the storage section 22, whether a predetermined period has not elapsed from past receipt of charge information from the in-vehicle device 100. Such a step is taken because, if a long period has lapsed from the point of receipt of charge information, the charge information is too old to be useful, and calculating a predicted value of charge information based upon this information lowers prediction accuracy, which is not preferable.

In Step S36, when a predetermined period has not elapsed (Step S36: YES), the process is advanced to Step S37, and it is checked whether or not a battery remaining amount received in the past is stored in the storage section 22. Such a step is taken because, information on a past battery remaining amount is required in calculating a predicted remaining amount of the battery and predicted time before completion of charging, and without this information, the prediction is virtually impossible.

It is to be noted that the order of Steps 36 and S37 may be reversed. Further, when the determination in Step S33 is "NO", Steps S36 and S37 may be omitted, and advanced directly to Step S38. Moreover, only one of Steps S36 and S37 may be omitted.

When the past battery remaining amount is stored in Step S37 (Step S37: YES), the process is advanced to Step S38. In Step S38, prediction information regarding a state-of-charge of the battery 30 is calculated using charge information and charge characteristic data received in the past and stored in the storage section 22. Specifically, a remaining amount of the battery 30 and time before completion of charging are respectively calculated as predicted values based upon a battery remaining amount received at the most recent point when communication with the in-vehicle device 100 was possible, elapsed time from the most recent receipt (counted with the clock 26), and the charge characteristic data. Next, in Step S39, the predicted remaining amount and predicted time as thus calculated are displayed in the display section 23.

Figure 11:
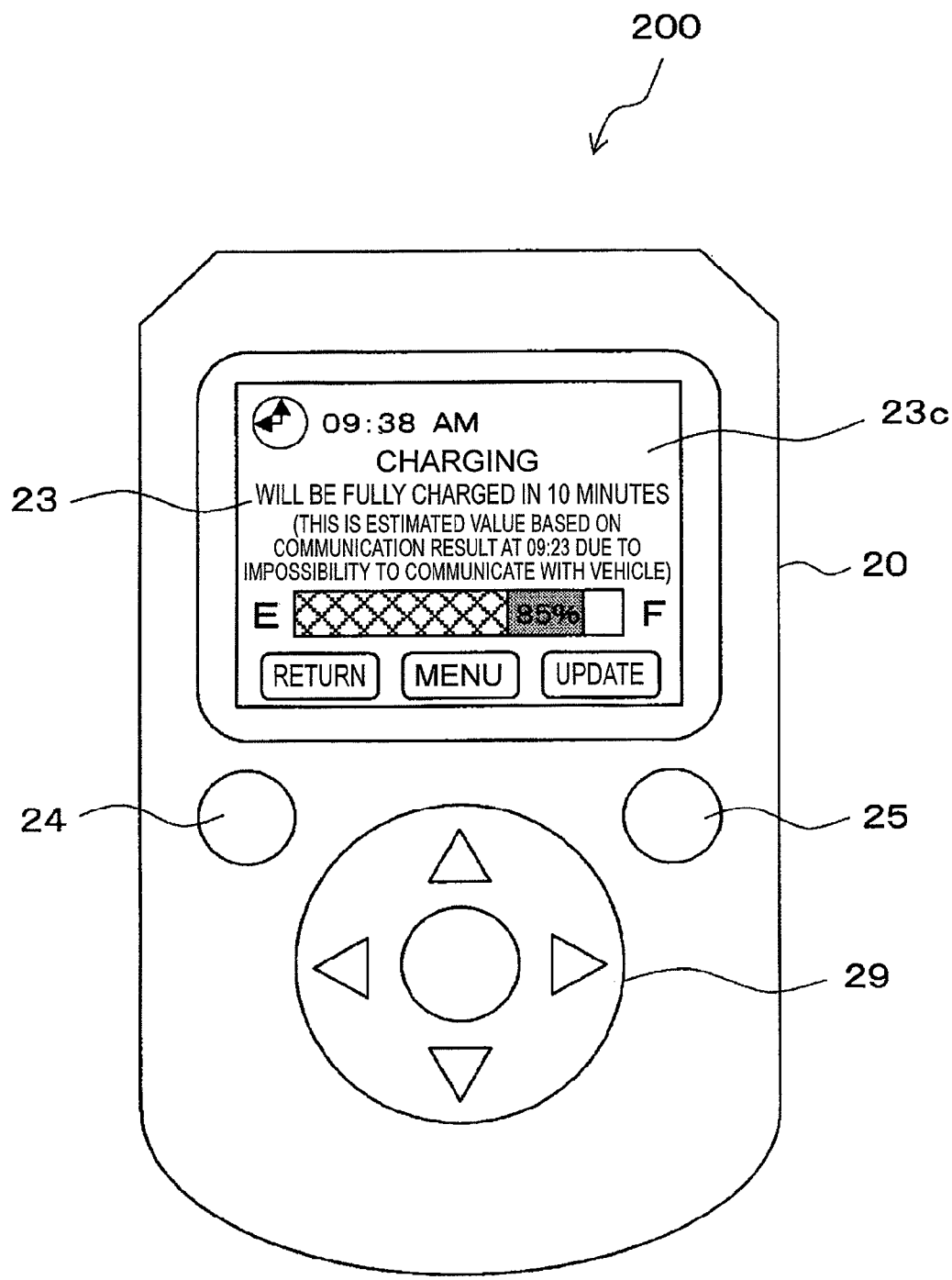
FIG. 11 is a view showing another display example of charge information.

FIG. 11 shows a display example of the display section 23 in Step S39. On the screen of the display section 23 displayed is information 23c indicating that the battery 30 is under charging, a battery remaining amount (85%) of the battery 30 and predicted time (10 minutes) before completion of charging. Although a message is also displayed indicating that the predicted remaining amount and predicted time are estimated values, this message may be omitted.

In this manner, even when the portable device 200 is in a situation where charge information cannot be received from the in-vehicle device 100, prediction information regarding the state-of-charge of the battery 30 is calculated on the portable device 200 side by the use of the past (most recent) charge information and the charge characteristic data, and then displayed in the display section 23. This can facilitate the user who owns the portable device 200 to know estimations of the remaining amount of the battery 30 and the time before completion of charging. Further, since prediction information is calculated using the charge characteristics generated at the point of charging the battery 30, it is possible to obtain highly accurate prediction information with surroundings, such as an ambient temperature, of the battery 30 during charging taken into consideration.

Returning to FIG. 8, when the predetermined period has elapsed from past receipt of charge information in Step S36 (Step S36: NO), the process is advanced to Step 41. In Step S41, a past charged date (the most resent date) stored in the storage section 22 and a battery remaining amount at that point are displayed in the display section 23 as past charge information.

Figure 12:
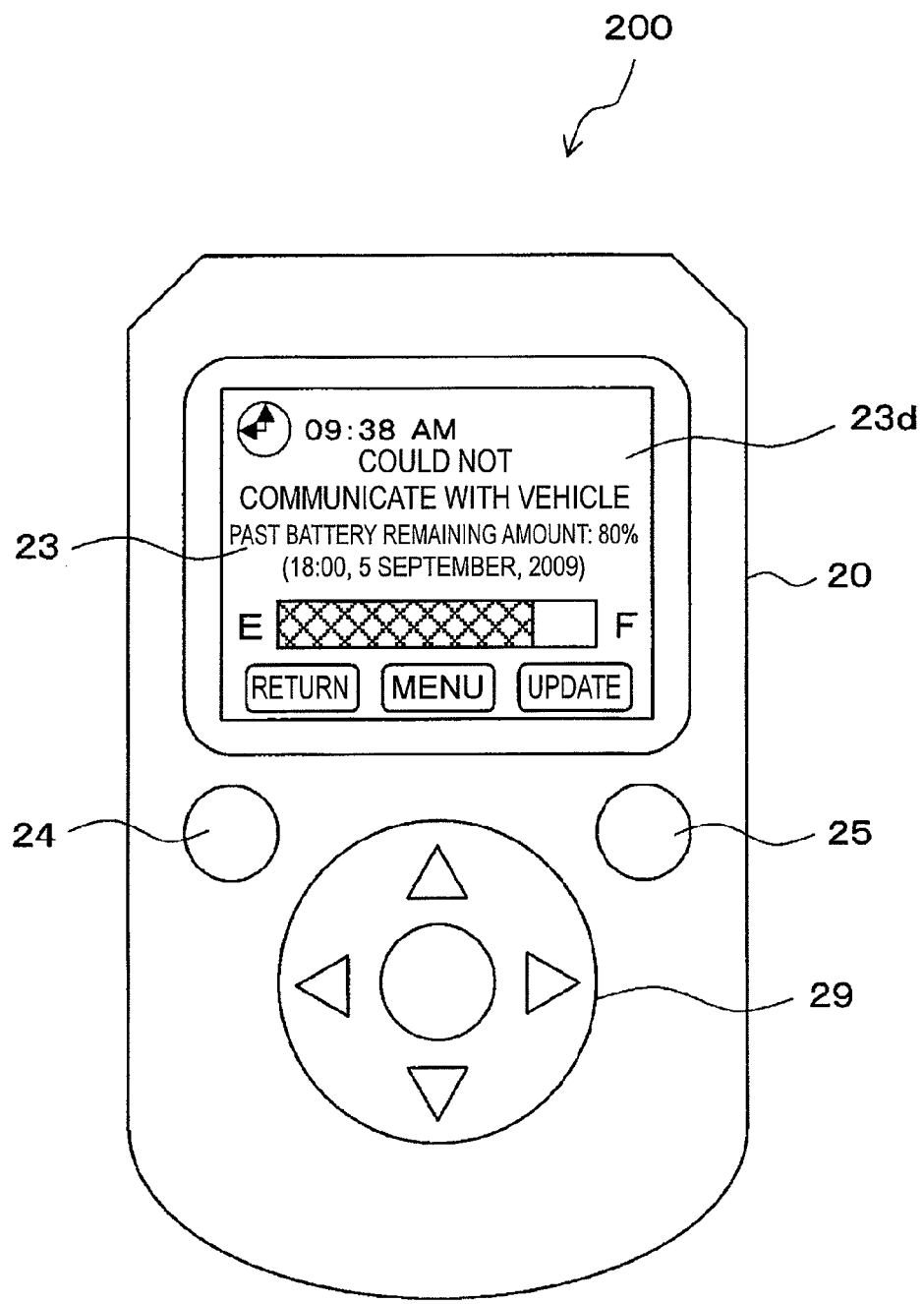
FIG. 12 is a view showing another display example of charge information.

FIG. 12 shows a display example of the display section 23 in Step S41. On the screen of the display section 23 displayed is information 23d indicating a past charged date and a battery remaining amount (80%) at that time, along with a message indicative that communication could not be performed with the vehicle. This can at least notify the user of the latest battery remaining amount in the past even when the portable device 200 cannot receive charge information from the in-vehicle device 100.

Further, when the battery remaining amount received in the past is not stored in the storage section 22 in Step S37 of FIG. 8 (Step S37: NO), the process is advanced to Step S40. In Step S40, since prediction information cannot be calculated based upon information on the past remaining amount, a remaining amount of the battery 30 and the time before completion of charging being unknown are displayed in the display section 23.

Figure 13:
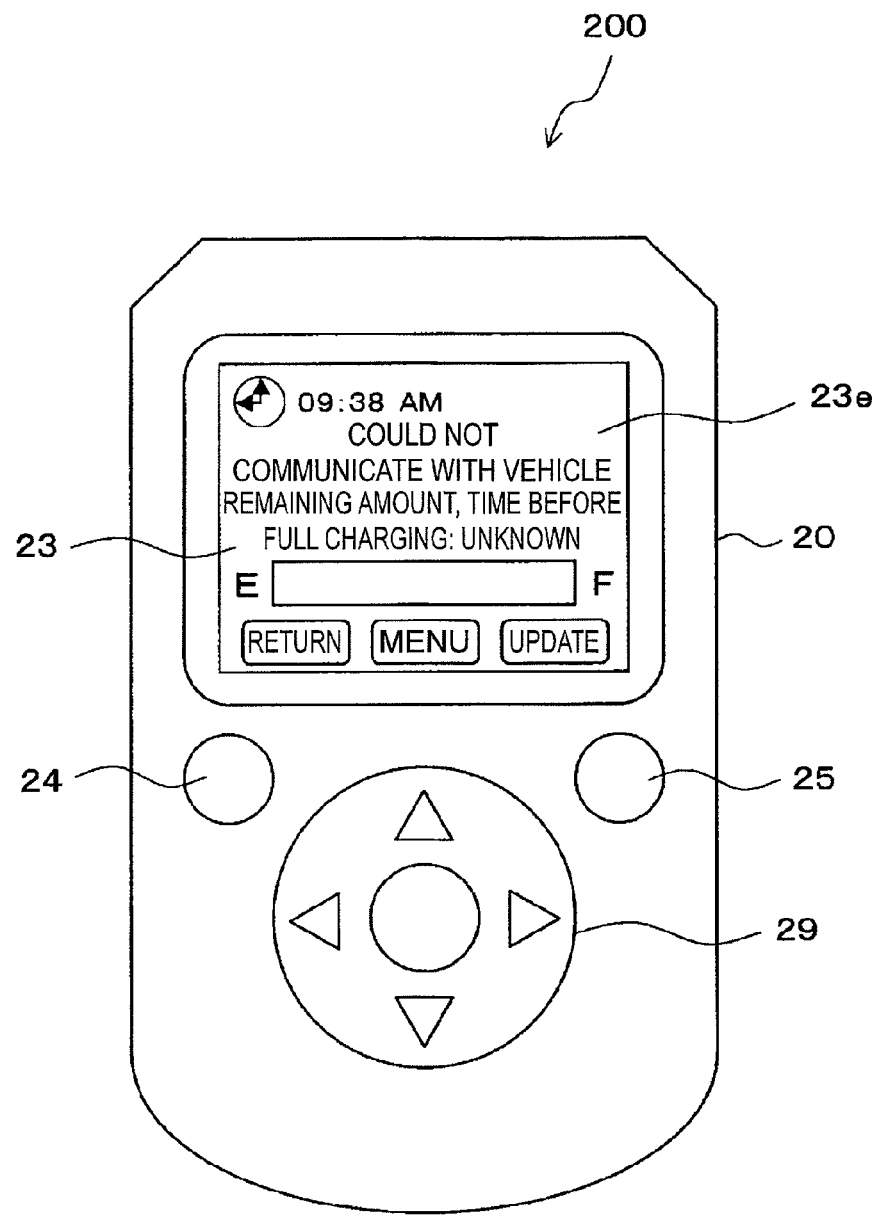
FIG. 13 is a view showing another display example of charge information.

FIG. 13 shows a display example of the display section 23 in Step S40. On the screen of the display section 23 displayed is information 23e indicating that a battery remaining amount and time before completion of charging are unknown, along with a message indicative that communication with the vehicle could not be performed.

A variety of embodiments of the present invention can be employed other than the embodiments described above. Hereinafter, several examples will be cited.

(1) In one or more of the above embodiments, in the portable device 200, when charge information cannot be received from the in-vehicle device 100, a current battery remaining amount and time before completion of charging are predicted using a battery remaining amount which was obtained from the in-vehicle device 100 in the past and is stored in the storage section 22, and these predicted values are displayed in the display section 23. However, a charging start time or a charged amount may be displayed in place of the predicted values. The portable device 200 in this case wirelessly transmits a signal, requesting charge information such as a charging start time for the battery 30 and a charged amount of the battery 30, from the transmission/reception section 21 to the in-vehicle device 100, wirelessly receives the above charge information from the in-vehicle device 100, and stores the received charge information into the storage section 22. When charge information cannot be received from the in-vehicle device 100 after the transmission/reception section 21 has transmitted the signal requesting charge information, the most recent charging start time or charged amount, which was obtained from the in-vehicle device 100 in the past and is stored in the storage section 22, is read and displayed in the display section 23. In the display section 23, only one of the charging start time and the charged amount may be displayed, or both of them may be displayed. Also according to such an embodiment, the user can grasp estimations of a battery remaining amount and time before completion of charging.

(2) Although the device dedicated for displaying battery charging information was cited as an example of the portable device 200 in one or more of the above embodiments, a door-opening/closing remote controller used in a keyless entry system for the vehicle may be made to also serve as the portable device according to one or more embodiments of the present invention.

(3) Although predicted time before completion of charging was calculated (Step S6) on the in-vehicle device 100 side in the flowchart of FIG. 4 in the above embodiment, the predicted time may be calculated on the portable device 200 side.

(4) Although the mechanical charge inquiry button 25 for inquiring about a remaining amount of the battery 30 and the like is provided in the portable device 200 in the present embodiment, the charge inquiry button may be displayed on the screen of the display section 23 and the button may be operated with the operation key 29.

(5) Although the case of charging the battery 30 with the dedicated charger 40 installed in the shopping center or the like was cited as an example in one or more embodiments of the present invention described above, one or more embodiments of the present invention is also applicable to the case of charging a battery by the use of a domestic power supply.

(6) Although the example of application of one or more embodiments of the present invention to the system for displaying charge information on a battery in the electric car or the hybrid car was cited above, one or more embodiments of the present invention is also applicable, for example, to a system for displaying charge information on a battery mounted in an automated guided vehicle or a robot.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A portable device for displaying charge information, comprising:
    a transmission unit for wirelessly transmitting a signal, requesting charge information on a battery, to a controller provided with a unit for detecting a remaining amount of a battery;
    a reception unit for wirelessly receiving the charge information from the controller;
    a storage unit for storing charge information received by the reception unit; and
    a display unit for displaying charge information stored into the storage unit, wherein
        during charging of the battery, the reception unit receives, from the controller, charge characteristic data representing a charged amount of the battery with respect to charging time for the battery,
        the storage unit stores the charge characteristic data received by the reception unit,
        the portable device further comprises a charge prediction information calculating unit for calculating prediction information regarding a state-of-charge of the battery based upon the charge information and the charge characteristic data stored in the storage unit in the case of the reception unit being unable to receive charge information from the controller after transmitting a signal requesting charge information from the transmission unit, and
        the display unit displays the prediction information calculated by the charge prediction information calculating unit when the charge prediction information calculating unit calculates the prediction information.

2. The portable device for displaying charge information according to claim 1, wherein
    the charge prediction information calculating unit calculates prediction information including a predicted remaining amount of the battery and predicted time before completion of charging.

3. The portable device for displaying charge information according to claim 1, wherein
    the device further comprises a first determination unit for determining whether or not a predetermined period has elapsed from past receipt of charge information in the case of the reception unit being unable to receive charge information from the controller after transmitting a signal requesting charge information from the transmission unit, and
    past charge information stored in the storage unit is displayed in the display unit when the first determination unit determines that the predetermined period has elapsed.

4. The portable device for displaying charge information according to claim 3, wherein
    the device further comprises a second determination unit for determining whether or not charge information received in the past is stored in the storage unit, and
    the charge prediction information calculating unit calculates the prediction information when it is determined by the first determination unit that the predetermined period has not elapsed and it is determined by the second determination unit that the charge information is stored in the storage unit.

5. A charge information display system, comprising:
    a controller comprising:
        a remaining amount detecting unit for detecting a remaining amount of a battery, and
        a first transmission unit for transmitting charge information on a battery, which includes a remaining amount detected in the remaining amount detecting unit; and
    a portable device for displaying charge information comprising:
        a second transmission unit for wirelessly transmitting to the controller a signal requesting the charge information,
        a reception unit for wirelessly receiving the charge information from the controller,
        a storage unit for storing charge information received by the reception unit,
        a display unit for displaying the charge information stored into the storage unit, wherein
            during charging of the battery, the reception unit receives, from the controller, charge characteristic data representing a charged amount of the battery with respect to charging time for the battery,
            the storage unit stores the charge characteristic data received by the reception unit,
            the portable device further comprises a charge prediction information calculating unit for calculating prediction information regarding a state-of-charge of the battery based upon the charge information and the charge characteristic data stored in the storage unit in the case of the reception unit being unable to receive charge information from the controller after transmitting a signal requesting charge information from the second transmission unit, and
            the display unit displays the prediction information calculated by the charge prediction information calculating unit when the charge prediction information calculating unit calculates the prediction information.

6. The charge information display system according to claim 5, wherein
during charging of a battery, the controller generates the charge characteristic data representing a charged amount of the battery with respect to charging time for the battery, and transmits the data from the first transmission unit to the portable device for displaying charge information.

7. The charge information display system according to claim 6, wherein
the controller generates the charge characteristic data based upon a current remaining amount, an ambient temperature and a charging system of the battery.

* * * * *